US011609812B2

(12) United States Patent
Burch et al.

(10) Patent No.: US 11,609,812 B2
(45) Date of Patent: Mar. 21, 2023

(54) ANOMALOUS EQUIPMENT TRACE DETECTION AND CLASSIFICATION

(71) Applicant: PDF Solutions, Inc., Santa Clara, CA (US)

(72) Inventors: Richard Burch, McKinney, TX (US); Jeffrey D. David, San Jose, CA (US); Qing Zhu, Rowlett, TX (US); Tomonori Honda, Santa Clara, CA (US); Lin Lee Cheong, San Jose, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 233 days.

(21) Appl. No.: 17/064,422

(22) Filed: Oct. 6, 2020

(65) Prior Publication Data
US 2021/0103489 A1    Apr. 8, 2021

Related U.S. Application Data

(60) Provisional application No. 62/911,346, filed on Oct. 6, 2019.

(51) Int. Cl.
| | |
|---|---|
| *G06N 20/00* | (2019.01) |
| *H01L 21/02* | (2006.01) |
| *G06F 3/0482* | (2013.01) |
| *G06N 3/08* | (2023.01) |
| *G06N 7/00* | (2023.01) |
| *G06F 11/07* | (2006.01) |
| *G06K 9/62* | (2022.01) |

(52) U.S. Cl.
CPC ........ *G06F 11/079* (2013.01); *G06F 11/0736* (2013.01); *G06F 11/0751* (2013.01); *G06F 11/0778* (2013.01); *G06K 9/6228* (2013.01); *G06K 9/6253* (2013.01); *G06K 9/6268* (2013.01); *G06N 20/00* (2019.01); *H01L 21/02* (2013.01); *G06F 3/0482* (2013.01); *G06N 3/08* (2013.01); *G06N 7/005* (2013.01)

(58) Field of Classification Search
CPC ............... G06F 11/079; G06F 11/0736; G06F 11/0751; G06F 11/0778; G06F 3/0482; G06K 9/6228; G06K 9/6253; G06K 9/6268; G06N 20/00; G06N 3/08; G06N 7/005; H01L 21/02
See application file for complete search history.

(56) References Cited

U.S. PATENT DOCUMENTS

| | | | |
|---|---|---|---|
| 11,232,368 B2* | 1/2022 | Tashman | ................ G06N 7/005 |
| 2017/0109646 A1 | 4/2017 | David | |
| 2019/0146032 A1 | 5/2019 | Stine et al. | |

OTHER PUBLICATIONS

International Search Report and Outgoing Written Opinion of the ISA, dated Jan. 8, 2021.

* cited by examiner

*Primary Examiner* — Roy Y Yi
*Assistant Examiner* — Geoffrey T Evans
(74) *Attorney, Agent, or Firm* — Dergosits & Noah LLP

(57) ABSTRACT

Scheme for detection and classification of semiconductor equipment faults. Sensor traces are monitored and processed to separate known abnormal operating conditions from unknown abnormal operating conditions. Feature engineering permits focus on relevant traces for a targeted feature. A machine learning model is built to detect and classify based on an initial classification set of anomalies. The machine learning model is continuously updated as more traces are processed and learned.

9 Claims, 10 Drawing Sheets

| Class | | Action | | |
|---|---|---|---|---|
| | | None | Monitor | Alarm |
| | Normal | Normal: Normal traces are used to update definition of normal in the model. | | |
| | Suspect | Suspect, Harmless: Trace is marginally abnormal and should not be used to update definition of normal, but is not something that can not affect the tool or wafer and does not need tracking. | Suspect, Monitor: Trace is marginally abnormal and might represent undesirable tool action. Frequency of this signal should be monitored. | Suspect, Alarm: Trace is marginally abnormal and should be immediately called to the attention of tool engineer for review. |
| | Anomaly | Anomaly, Harmless: Trace is clearly abnormal and should not be used to update definition of normal, but is not something that can not affect the tool or wafer and does not need tracking. | Anomaly, Monitor: Trace is clearly abnormal but does not require immeidate action. Monitor frequency and severity. | Anomaly, Alarm: Trace is clearly abnormal and requires immediate review and action by tool engineer. |

FIG. 6

ANOMALOUS EQUIPMENT TRACE DETECTION AND CLASSIFICATION

CROSS REFERENCE

This application claims priority from U.S. Provisional Application No. 62/911,346 entitled Equipment Trouble Prevention (ETP): An effective approach to Anomalous Equipment Trace Detection and Classification without Prior Labeling, filed Oct. 6, 2019, incorporated herein by reference in its entirety.

TECHNICAL FIELD

This application relates to detection and classification of semiconductor equipment faults, and more particularly, to a scheme for monitoring and processing sensor traces in order to detect and classify unknown abnormal equipment operating conditions.

BACKGROUND

The detection of equipment faults by monitoring time traces of equipment sensors is a long-recognized but very difficult problem in semiconductor manufacturing. The classical approach to Fault Detection and Classification (FDC) is to calculate summary statistics (frequently called key number or indicators) from the sensor traces and then monitoring those statistics to identify anomalies. based primarily on engineering knowledge.

For example, in FIG. 1A the regions between dashed vertical lines are process windows 100 displaying four different equipment sensor traces 101, 102, 103, 104 from a portion or step of the semiconductor process. Statistics are normally computed for each step of the trace, as shown in FIG. 1B. However, the statistics fail to reveal the anomaly 110 that is visually evident in FIG. 1A from the graph of Trace 104. Thus, important anomalies may be missed by relying only upon statistical process control techniques. Of course, the effectiveness of the statistical process control approach varies and is largely dependent on the quality of the summary statistics. In addition, the routines for calculating summary statistics need to be updated often with process changes. Thus, the construction and maintenance of FDC summary statistic routines represents a large investment of scarce resources.

The number of statistics required to adequately represent the sensors of any moderately complex process step can run into the thousands or even tens of thousands, making false signals a huge concern. Efforts to select relevant statistics based on analysis of product data and/or inline metrology have proven useful in reducing false signals, but such efforts require adequate response data yet still cannot predict previously unobserved faults.

Another approach has been with trace replication, for example, using an autoencoder neural network, or something as simple as principle components, a limited set of basis vectors is identified that can accurately reconstruct most traces. Traces with a high residual are assumed to be anomalies, and the residual sum of squares can be used to detect the anomaly. However, while the replicator approach works well to identify anomalies in many traces, the basis vectors often have no clear physical interpretation, which makes it difficult for the user to classify the anomalies based on that information.

Recent advancements in machine learning have opened up new opportunities to enhance the power of equipment fault detection and classification based on the detection and classification of anomalous sensor traces. One of the hurdles in implementing machine learning for anomalous trace detection and classification, however, is the difficulty in obtaining labeled trace data. Therefore, any truly effective methodology for anomalous trace detection and classification must implement effective strategies for anomalous trace identification without any labels and must leverage initial classifications to collect labels for continuous improvement of detection and classification.

DESCRIPTION OF DRAWINGS

FIG. 6 is a table of pre-defined classes of anomalies and corresponding possible actions.

DETAILED DESCRIPTION

As used herein, the term "sensor trace" refers to time-series data measuring an important physical quantity periodically during equipment operation, while the term "trace" or "equipment trace" refers to the collection of sensor traces for all important sensors identified for a processing instance.

The problem addressed by this disclosure is abnormal operation of semiconductor processing equipment. The ability to identify abnormal equipment operation by monitoring the sensor data collected during processing, separating known abnormal operation conditions from unknown operation conditions, and classifying those unknown conditions to enable rapid response, has been a long-recognized but difficult problem to solve. Thus, an objective of this disclosure is to address this problem by describing a real-time capability to identify any equipment sensor traces that show significant anomalies as compared with normal operating traces.

The evaluation of this problem is facilitated by the emergence of parallel processing architectures and the advancement of Machine Learning algorithms which allow users to gain insights and make predictions using massive amounts of data at speeds that make such approaches relevant and realistic. Machine Learning is a branch of artificial intelligence that involves the construction and study of systems that can learn from data. These types of algorithms, and along with parallel processing capabilities, allow for much larger datasets to be processed, and are much better suited for multivariate analysis.

Much of the power in machine learning is the ability to accurately classify in a noisy high-dimensionality space. However, the effectiveness of detection and classification schemes can be improved with physically meaningful feature engineering. Furthermore, good feature engineering can dramatically assist in understanding the root cause behind similar anomalous traces. An effective machine learning approach to anomalous trace detection and classification should facilitate active learning and use the information gained to continuously improve the accuracy of both fault detection and classification.

In the production environment, prior labeling of abnormal trace examples is often unavailable. Thus, an effective system for detection of anomalous traces cannot depend on prior labels. However, if the burden on process engineers to provide labels can be minimized and the benefit demonstrated, useful input to the labeling process can be obtained through such efforts. A review of the accuracy of classification labels should be included and relabeling performed as needed to improve detection and classification of relevant models.

Figures 1A, 1B:
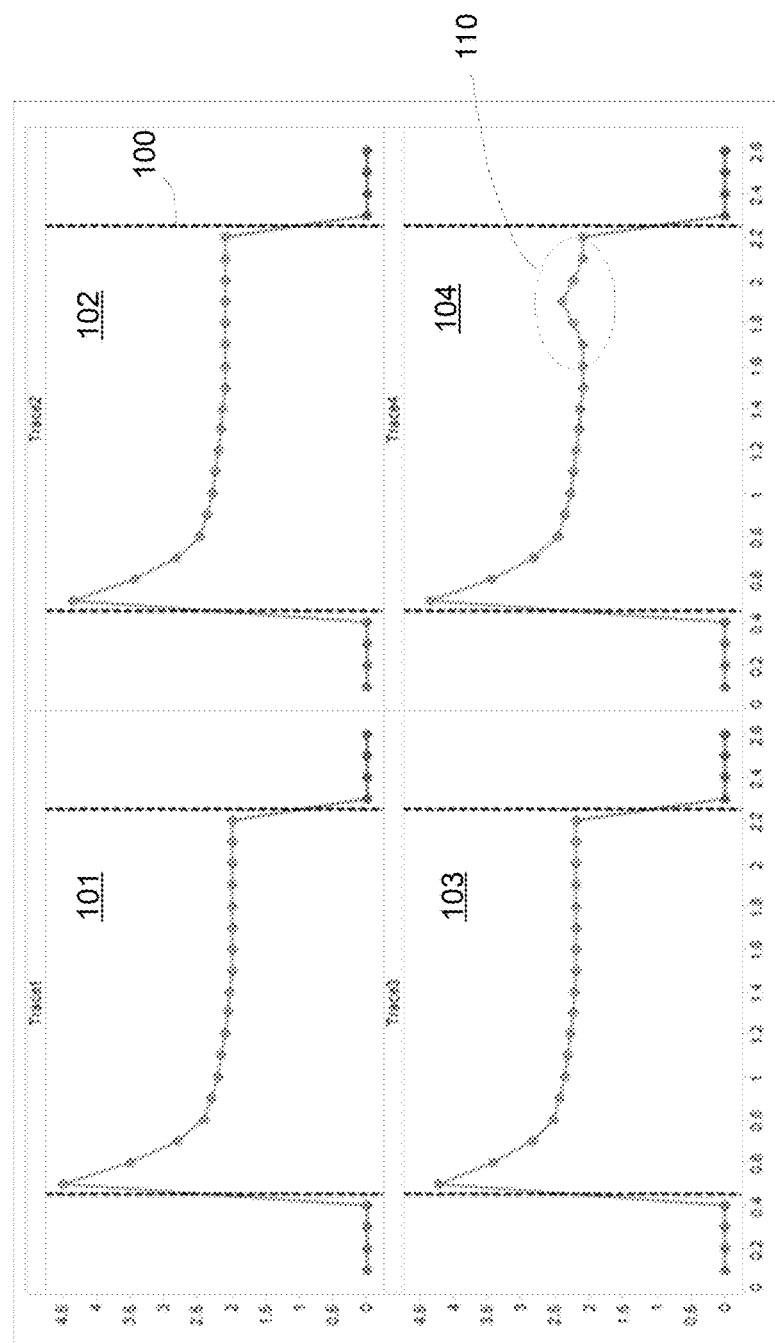
FIG. 1A is a process display window illustrating four equipment sensor traces.
FIG. 1B is a table with summary statistics for the traces shown in FIG. 1A.
Figure 2:
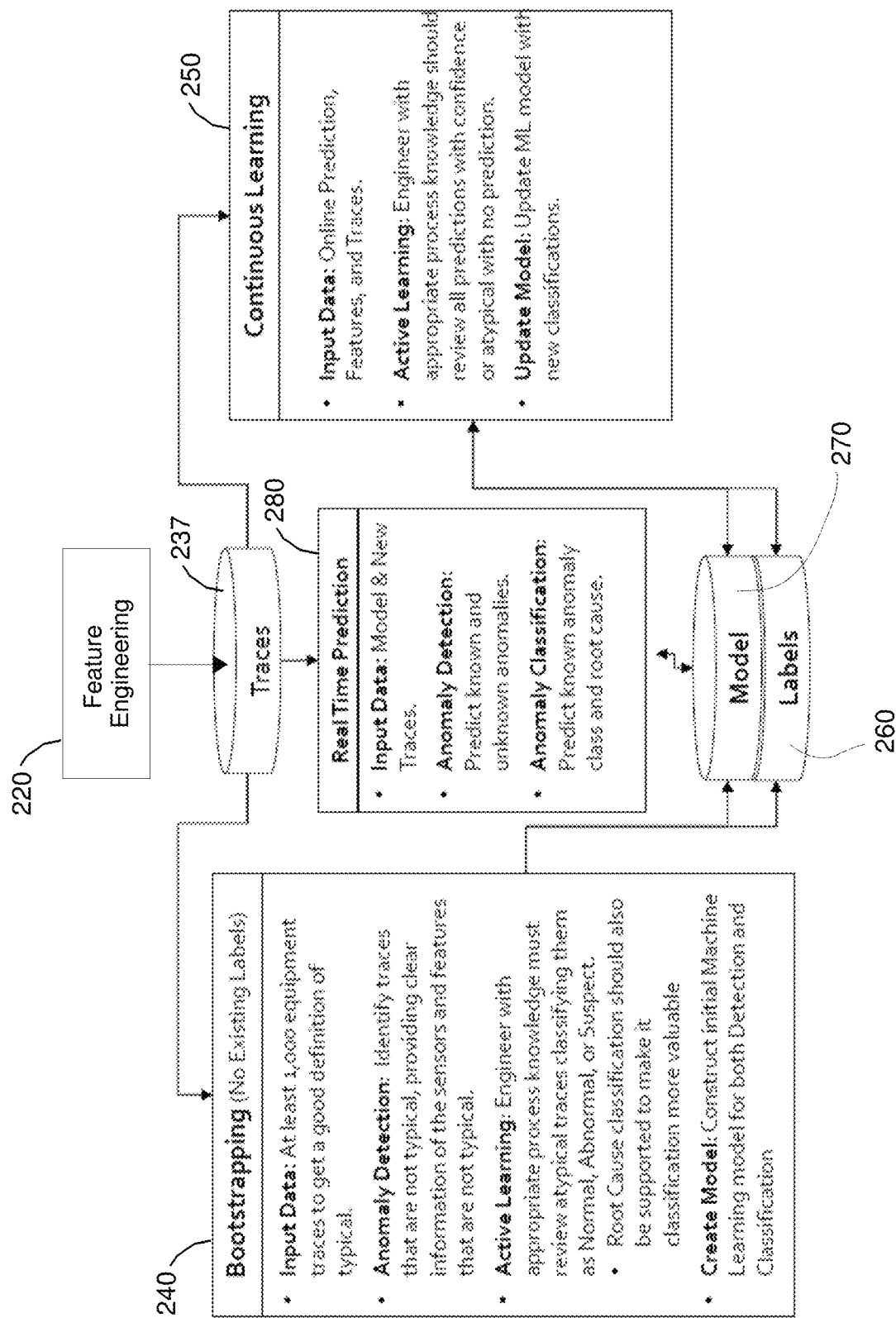
FIG. 2 is a simplified block diagram illustrating an anomaly detection and classification system.

A simplified overview of a system 200 for anomalous trace detection and classification is illustrated in FIG. 2. The system is computer-based such that the various modules can be installed and run on a state-of-the-art stand-alone desktop computer or equivalent having a conventional operating system, or made available to users through a hosted service accessible through the Internet or other network.

In module 220, "feature engineering" is performed to identify key features and the relevant sets of equipment trace data. The feature engineering 220 results in identifying and using traces in module 237 that are useful to evaluate a targeted feature. "Bootstrapping" is performed on the traces in module 240 to create classification labels based primarily on the key features identified in module 220. This results in labels that are saved and stored at module 260.

When sufficient labels have been collected in the bootstrapping module 240 and saved into module 260, the bootstrapping phase transitions into the continuous learning phase in module 250, where the anomaly detection and classification model is initially built and will be continuously (or periodically or sometimes) updated. Classifications (labels) are reviewed and updated as needed. Once the model is built, it can be deployed from module 270 to make real-time predictions in module 280.

Figure 3:
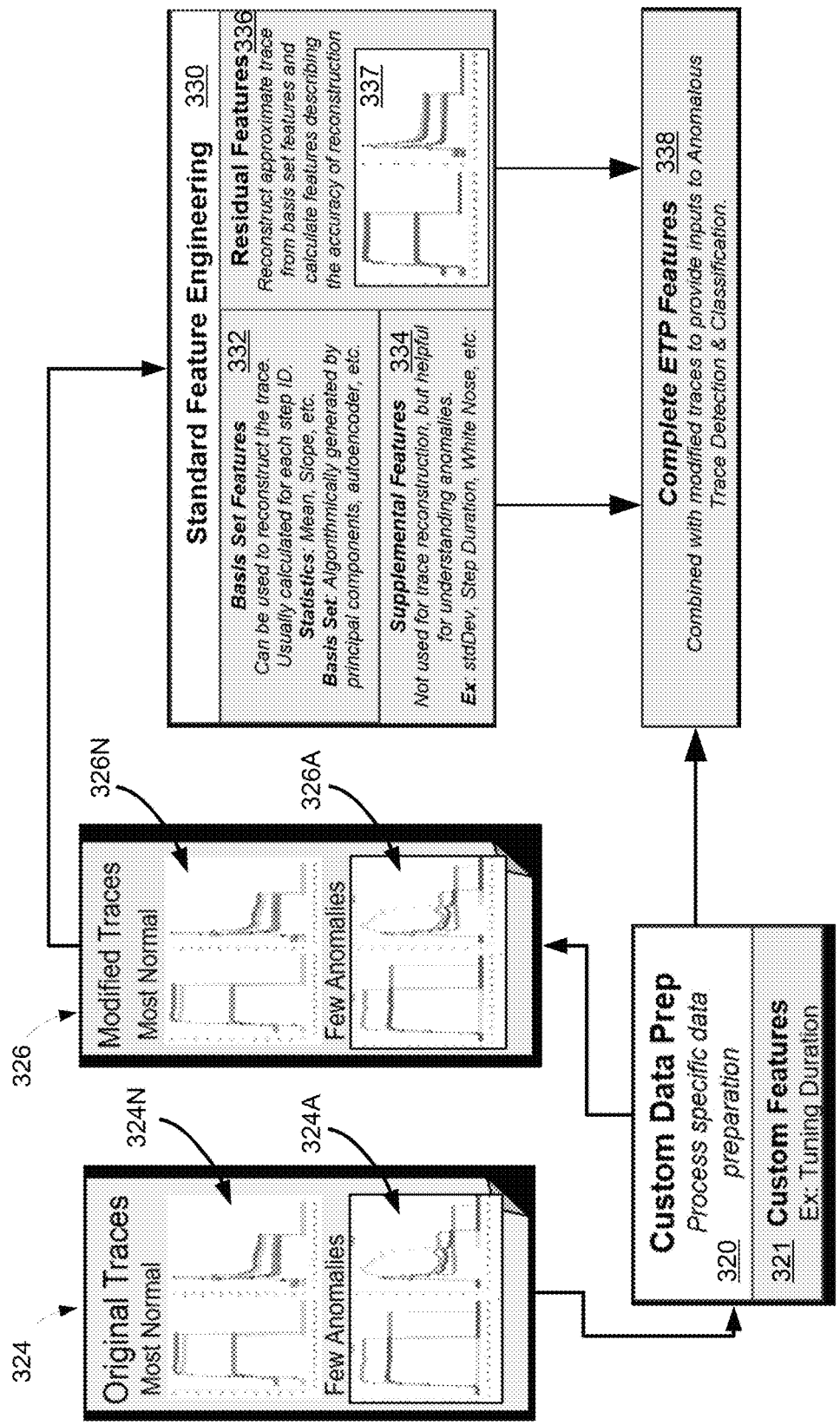
FIG. 3 is a detailed representation of a portion of FIG. 2.

The feature engineering module 220 is shown in more detail in FIG. 3 and includes two main processing stages: custom data preparation in stage 320 and standard feature engineering in stage 330. Ideally, feature engineering would not require any specific process knowledge; however, in many cases that is unrealistic. For example, under certain conditions, an implanter will enter a tuning cycle during which the sensors record sensor values that vary significantly from normal operation and do not directly affect the wafer. Thus, as one example, during the custom data preparation of stage 320, a key feature is identified as the tuning cycle and is separated from the rest of the trace, the trace is adjusted or modified, and a custom set of features is created that represent, in this example, the number of tuning periods for the wafer, the tuning duration, and the change in each trace before and after tuning. These features can be combined with the modified traces in stage 338 to provide inputs to the detection and classification model.

This is represented graphically in FIG. 3 as the original traces 324 include mostly normal traces 324N and a few traces 324A showing anomalies. The original traces 324 are modified in stage 320 and the modified traces 326 include modified normal traces 326N and the few modified anomaly traces 326A. The modified traces 326 are passed into stage 330 and the identified custom features are sent to stage 338 as part of the complete feature set for the detection and classification models.

In stage 330, most of the features needed by the detection and classification model are standardized features and the calculation of them is handled without engineering input.

For example, "Basis Set" features are generated in module 332. First, basic statistics (median and slope) in each step identifier ("step ID") are calculated and the traces are modified to remove those characteristics. Then, well-known algorithmic solutions such as principal components, autocoder, and others are used to algorithmically calculate a comprehensive basis set for the modified traces. Combined, these features (algorithmic basis set features, median, and slope) form a basis set, since the original traces can be reconstructed, with acceptable accuracy, given a full list of these basis set features. However, previously unobserved anomalous traces will not be accurately reproduced with this basis set.

"Supplemental" features are generated in module 334 and are not used for trace replication, but can be useful for understanding the root cause for anomalies. Supplemental features may be generated to focus on known impactful measures, such as standard deviation, step duration, white noise, etc.

A trace 337 is reconstructed as an approximation of the original trace using the Basis Set features and "Residual" features as generated in module 336 to describe the accuracy of the reconstruction. The Residual features capture unknown trace variations that are not captured in the Basis Set features.

Finally, the Basis Set features from module 332, the Supplemental features from module 334, and the Residual features from module 336 are combined with the original traces, the modified traces, and the reconstructed traces, as inputs to a machine learning model 270 (see FIG. 2) that is configured and trained for detecting and classifying trace anomalies. The model identifies anomalous traces and classifies those traces based on user feedback and can be implemented using a two-phase approach.

Returning to FIG. 2, the Bootstrapping phase 240 is utilized to generate initial labels, and the Continuous Learning phase 260 collects and applies new learning as historical labels are accumulated. The bootstrapping phase 240 assumes that there are many unlabeled multi-sensor equipment traces as inputs, anywhere from a few hundred to perhaps thousands. While there are no labels with the input data, the model assumes that most of the traces represent normal tool operation. The goal of the bootstrapping phase is to identify univariate and multivariate outliers based primarily on the key features identified from the initial data in the feature engineering stage 220.

Figure 4A:
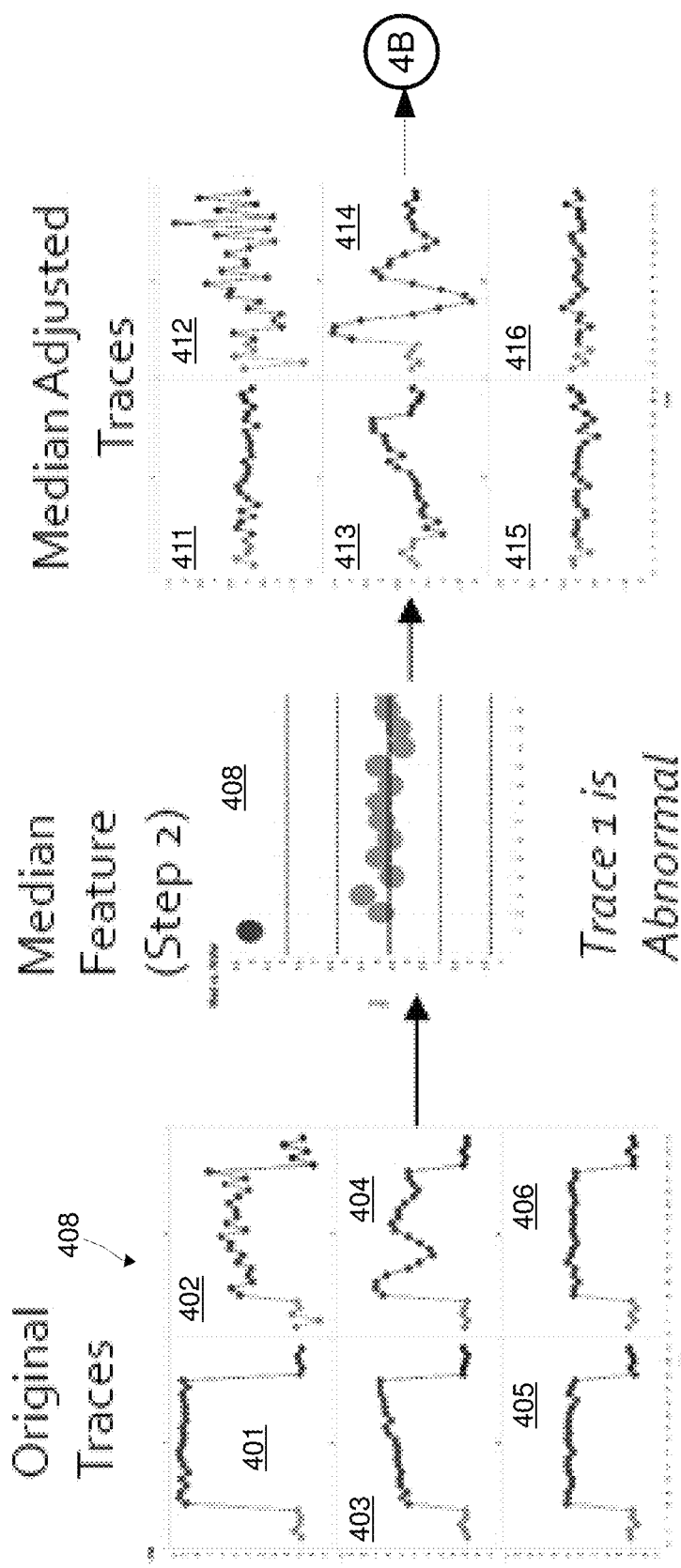
FIGS. 4A and 4B are graphical representations of a bootstrapping example.
Figure 4B:
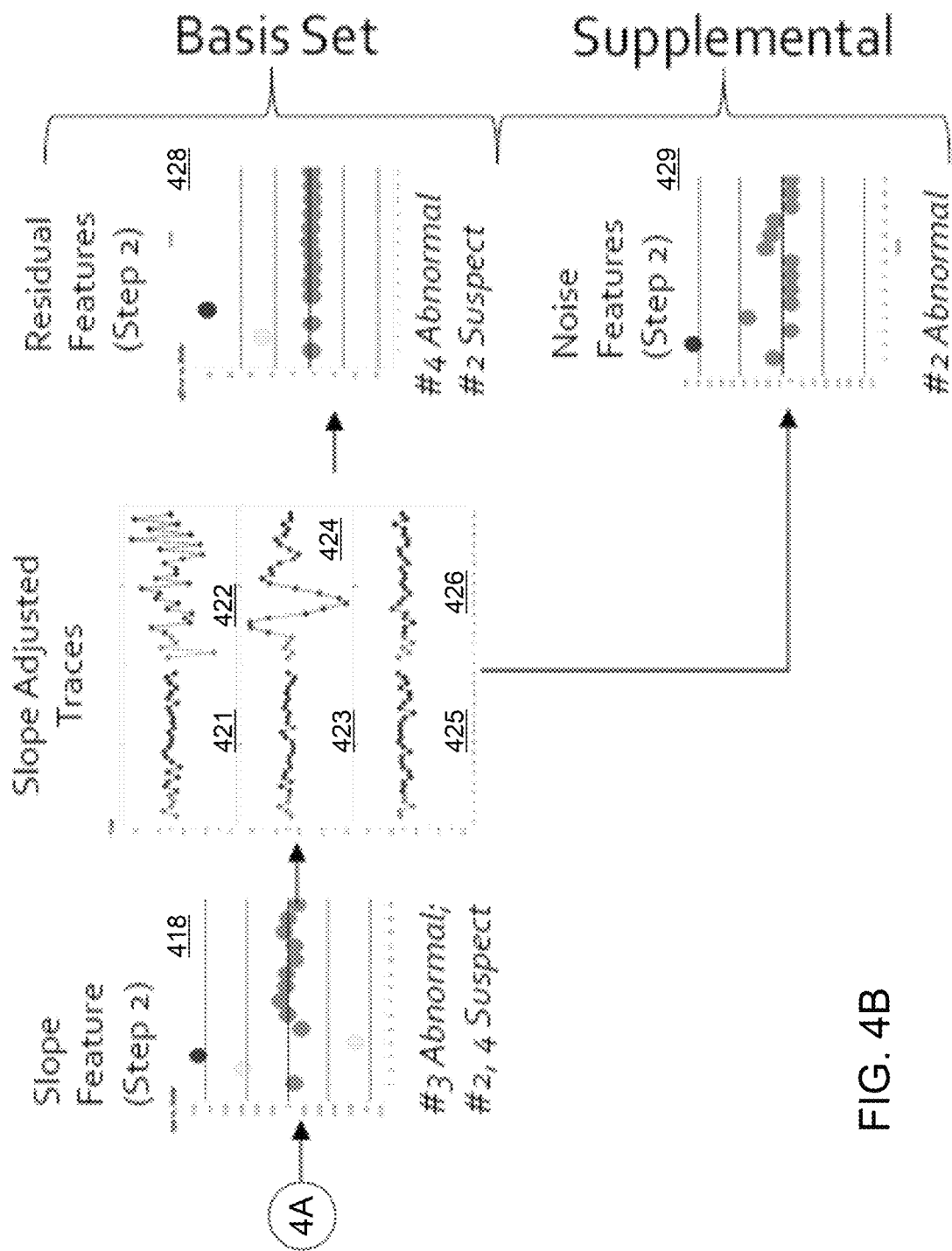

For example, FIGS. 4A and 4B illustrate a bootstrapping example at a selected process step in which original traces 400 include a first trace 401, a second trace 402, a third trace 403, a fourth trace 404, a fifth trace 405, and a sixth trace 406. In addition to four abnormal traces as will be shown here, there will be several hundred (or more) normal or typical traces input to the bootstrapping module.

The medians of the traces are calculated and displayed together at graph 408, in which it is visually clear that trace 401 is an outlier and therefore abnormal. The original traces 401-406 are modified and displayed as median-adjusted traces 411-416.

The slopes of the median-adjusted traces 411-416 are then calculated and displayed together at graph 418, in which trace 413 is abnormal and traces 412 and 414 are suspect. The traces 411-416 are again modified and displayed as slope-adjusted traces 421-426. Once median and slope are known, the algorithmic basis set features are calculated and the features that capture most of the remaining trace variation are selected. In this simple example, the only significant basis features are median and slope. The residual features (generally sum of square errors between original trace and the approximate trace reconstructed from basis set features) are then calculated. From the residual features 428, it is clear that trace 424 is abnormal and trace 422 is suspect.

Supplemental features can be exposed for root cause analysis by filtering for other criteria. For example, extracting a noise feature for the modified traces 421-426 results in graph 429 in which trace 422 is shown to be abnormal.

Figure 5A:
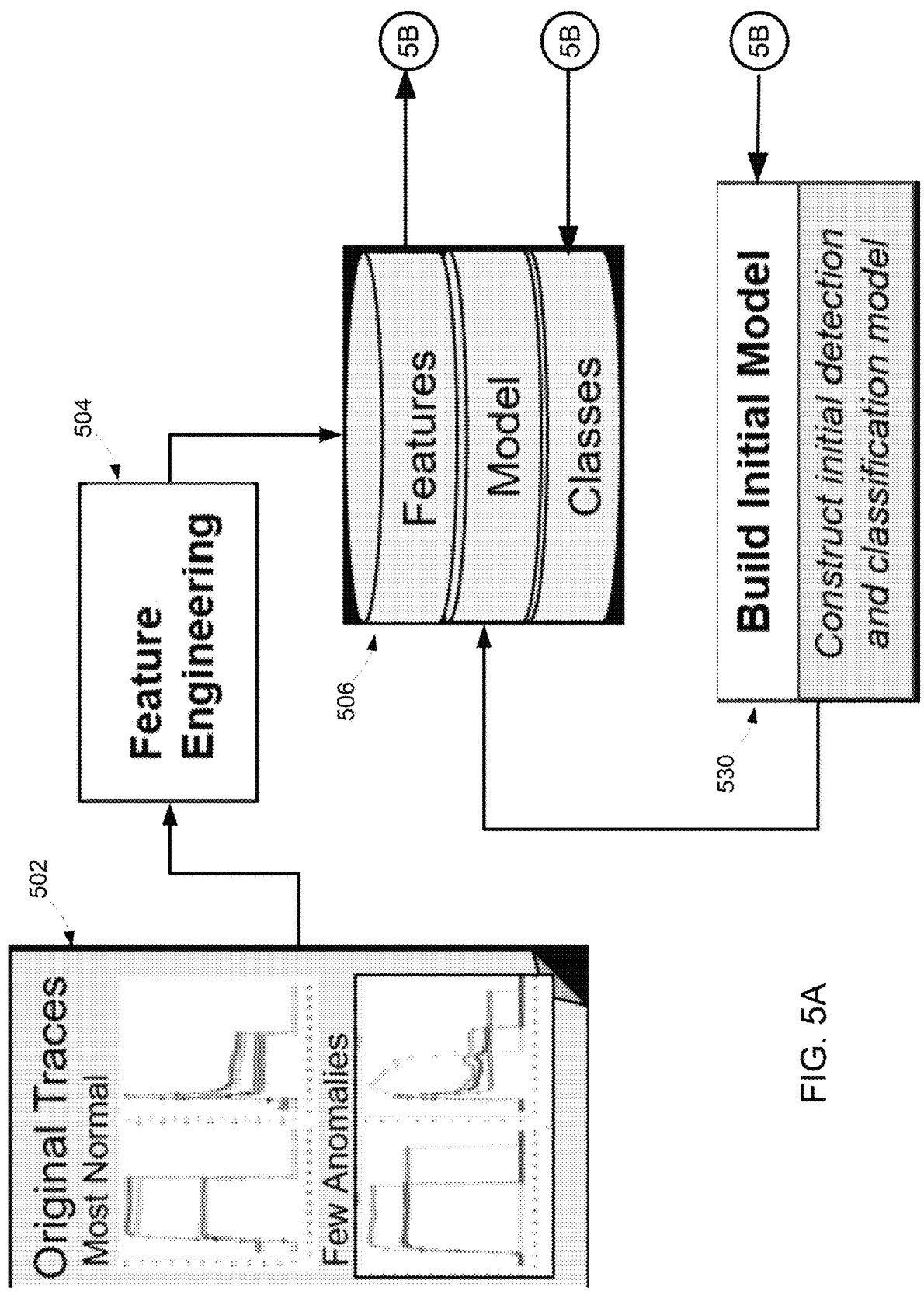
FIGS. 5A and 5B are block diagrams of a system for classifying trace anomalies.
Figure 5B:
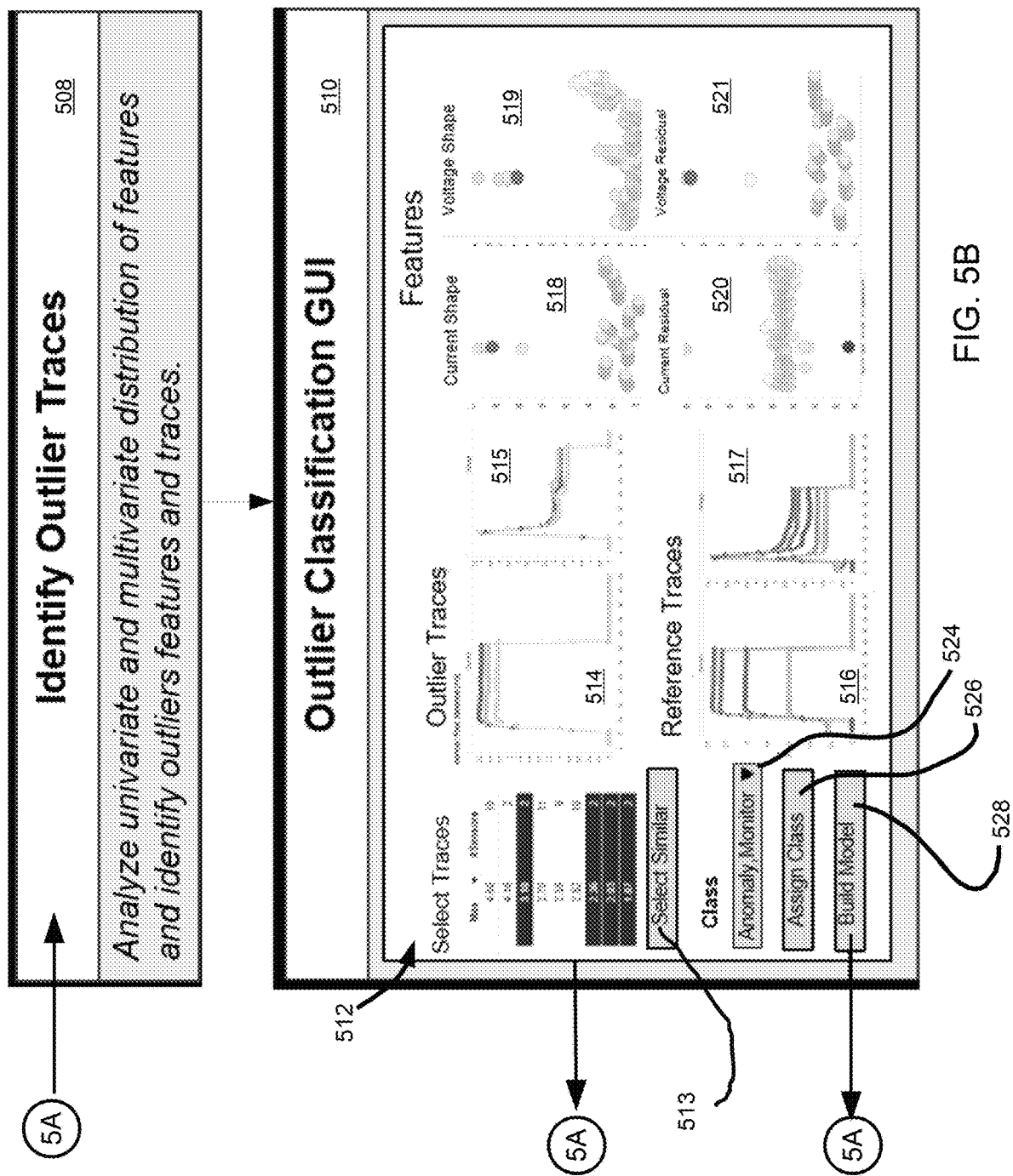

A system 500 representing the bootstrapping phase 240 is illustrated in FIGS. 5A and 5B. Original traces 502 include mostly normal traces and a few anomalies, and are input to feature engineering module 504, where key features are identified and saved to module 506. In module 508, outlier traces and features are identified by analyzing univariate and multivariate distribution of the key features from feature selection. The outliers are then classified by the user in a graphical user interface (GUI) 510.

In this example, GUI 510 is configured with a list 512 of available traces and the user can select one or more to view. In this view, four traces have been selected and displayed as outlier traces in windows 514, 515 and reference traces in windows 516, 517. Button 513 enables the user to select more traces that are similar. Window 514 shows four abnormal current traces while window 515 shows four abnormal voltage traces. Window 516 shows six reference current traces and window 517 shows six reference voltage traces. Current shape (algorithmic basis set) features are displayed in window 518, voltage shape features displayed in window 519, current residual features displayed in window 520, and voltage residual features displayed in window 521 are abnormal for all four abnormal traces displayed in windows 514, 515.

The outliers can be classified using button 524, which in this example is a pull-down list allowing the user to choose one of several pre-defined classifications and related actions, and to assign that classification/action to this particular anomaly via button 526. For example, FIG. 6 is a table of pre-defined classes and actions that could be implemented via button 524 or other equivalent modes. Three classes are defined: normal, suspect and anomaly. For each class, actions are defined. If the user classifies an outlier as normal, then no action is necessary, and the normal traces are used to update the definition of normal traces in the detection and classification model.

If the user classifies an outlier as suspect or definitively as an anomaly, then a further indication is provided with the classification as to whether the outlier is harmless, requires monitoring, or should trigger an immediate alarm condition, as indicated in FIG. 6. The final decisions about abnormality classifications will typically include some form of expert review.

After all the outliers have been assigned to classes, the initial detection and classification model is built in module 530 using all the processed trace data as a training set for a machine-learning based model. The model can then be used as a stand-alone or an online anomalous trace detection and classification system.

In the continuous learning module, input data includes online predictions, engineered features, and trace data (original and adjusted). The interactive GUI facilitates active learning for building accurate anomaly detection and classification models. The ability to identify similar traces algorithmically is a key to efficient active learning.

Figure 7A:
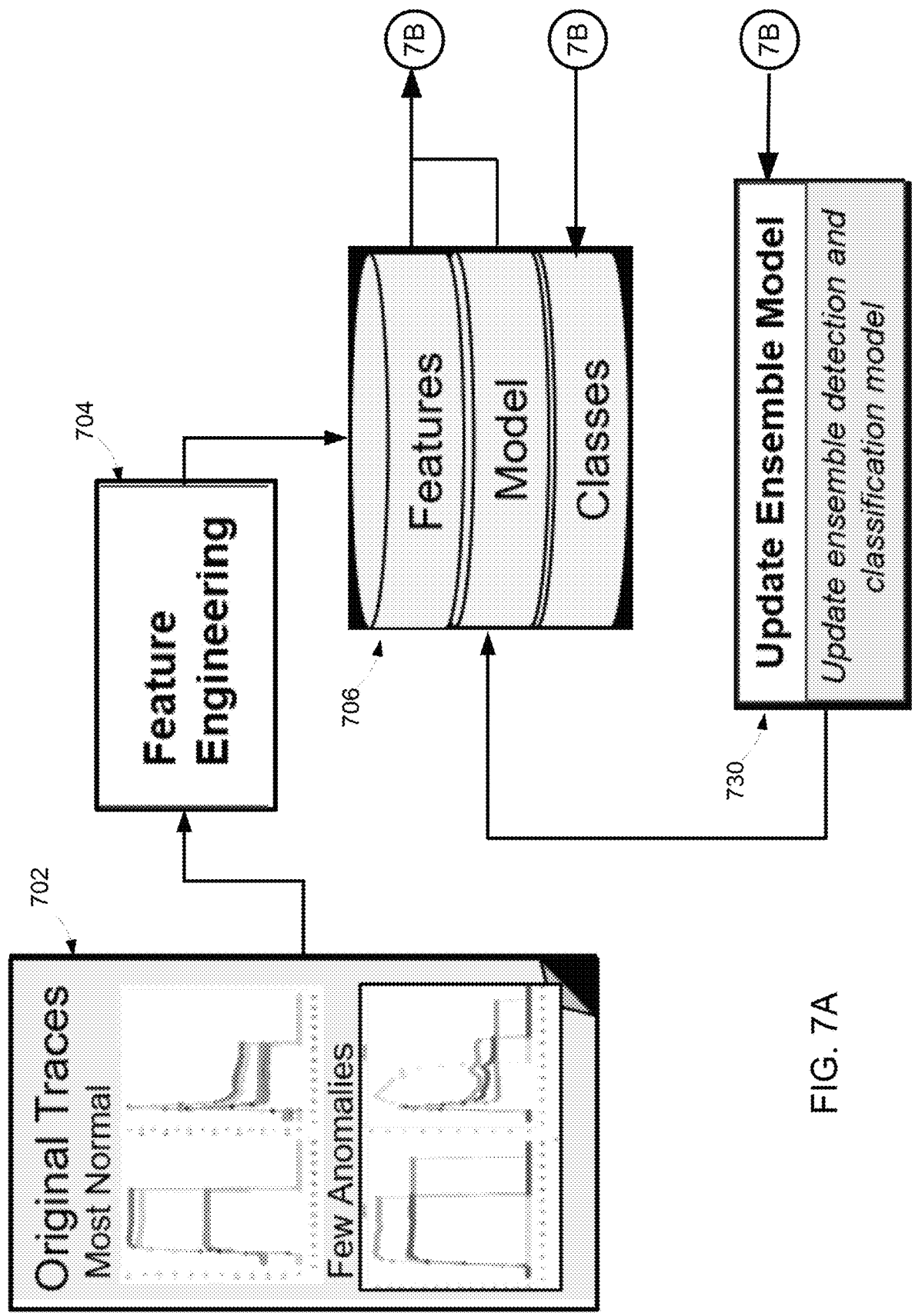
FIGS. 7A and 7B are block diagrams of a system for reviewing and updating the classification of trace anomalies.
Figure 7B:
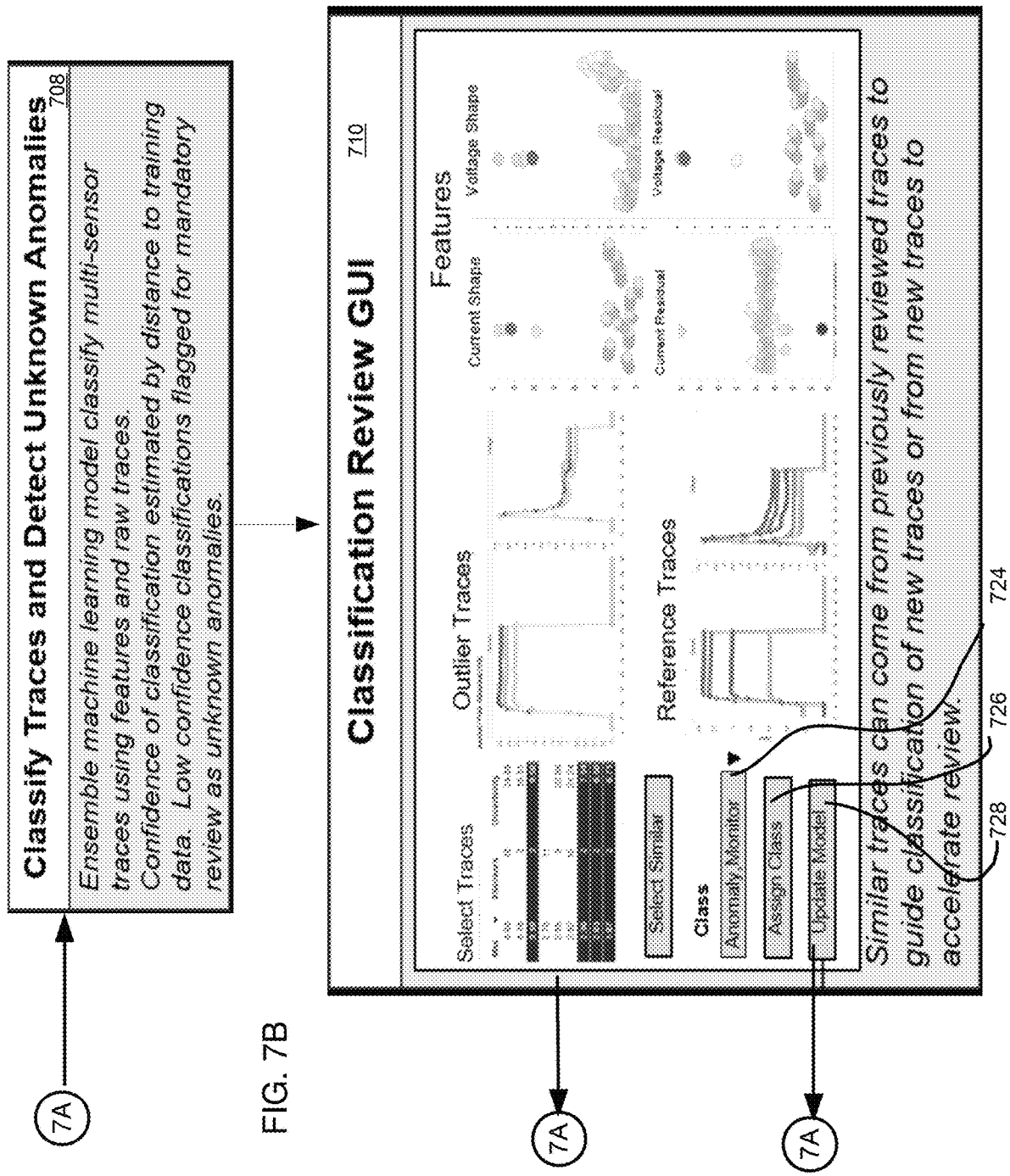

A process engineer with appropriate process knowledge should preferably review all predictions to build confidence level factors that can be incorporated into the model. For example, FIGS. 7A and 7B are similar to FIGS. 5A and 5B in illustrating an environment for classification review. The GUI 710 is similar to GUI 510 and allows the reviewer to select traces, select the appropriate class and action with button 724, assign that class/action with button 726, and then update the model in module 730 with the new learning via button 726.

Continuous learning utilizes the existing detection and classification machine learning model to predict most probable classification for each wafer, but also predicts the confidence based on the similarity between the nearest training data and the new traces. The lowest confidence predictions are flagged for mandatory review and are most likely unknown anomalies.

Although anomaly detection at its most basic is univariate (is the feature normal or not?), multivariate methods can be used to identify additional anomalies that are not readily apparent from univariate analysis. For example, some equipment malfunctions may be more readily observable from evaluation of multiple sensor traces, such as where an instance of both temperature and pressure excursions occur, action may be much more likely that if only one of the parameters is considered. Conversely, an equipment malfunction will usually generate multiple anomalies on multiple sensors, and the multivariate signature is important to predicting the root cause.

An appropriate machine learning algorithm for root cause classification is preferably a function of the data characteristics and the data volume. For example, if the data volume is very low, a simple nearest neighbor algorithm will likely yield the best results. If the data volume is moderate and the principal data variation is captured by the engineered features, then some of the sophisticated tree-based methods, such as extreme gradient boosting, may be excellent choices. If the data volume is sufficient and there are strong residual effects in the trace that are relevant to the root causes, then a convolutional neural network is probably the best choice. To solve this problem with minimal user input, a cross-validation-based model selection routine is utilized to construct the classification model, and in many cases, multiple models are used with a simple aggregation model used to combine the multiple predictions into a single prediction.

The invention claimed is:
1. A process for detecting and classifying anomalies in semiconductor equipment trace data, comprising:
  receiving a multiplicity of original traces from respective semiconductor equipment sensors into a processor-based model;
  identifying at least a first key feature for the multiplicity of original traces using the processor-based model;
  identifying by the processor-based model a plurality of anomalies in at least a first set of traces of the multiplicity of original traces;
  modifying each of the first set of traces on the basis of the first key feature using the processor-based model;
  generating a basis set of features from each of the modified first set of traces using the processor-based model;
  creating a plurality of reconstructed traces from the modified first set of traces and the basis set of features using the processor-based model;
  training a machine learning model to detect and classify anomalies based on the first set of traces, the modified first set of traces, and the reconstructed traces; and
  deploying the machine learning model in a semiconductor equipment operating environment for identifying and classifying anomalies in trace data.

2. The process of claim 1, further comprising:
receiving additional traces from the respective semiconductor equipment sensors;
identifying additional anomalies in a first set of the additional traces;
modifying the additional traces to remove a basic set of statistical characteristics;
generating the basis set of features from the modified additional traces;
creating reconstructed additional traces from the modified additional traces; and
updating the machine learning model based on the first set of original traces, the modified additional traces, and the reconstructed additional traces.

3. The process of claim 2, further comprising:
determining residual features as unknown trace variations not captured in the basis set of features;
determining supplemental features having a known impact on the first targeted feature; and
updating the machine learning model based on the first set of original traces, the modified additional traces, the reconstructed additional traces, the basis set of features, the residual features and the supplemental features.

4. The process of claim 1, further comprising:
identifying an effective correlation between the first set of traces and the first predefined targeted feature.

5. The process of claim 1, further comprising:
identifying an effective correlation between the first set of traces and a plurality of predefined targeted features.

6. The process of claim 1, the step of generating a basis set of features further comprising:
calculating a set of statistical characteristics of the first set of traces;
modifying the first set of traces to remove the set of statistical characteristics;
calculate an algorithmic solution for the modified first set of traces;
wherein the algorithmic solution and the set of statistical characteristics form the basis set of features.

7. The process of claim 1, wherein the multiplicity of original traces includes mostly normal traces and the plurality of anomalies represents only a few anomalies.

8. The process of claim 1, further comprising;
providing a graphical user interface for reviewing a selected trace anomaly;
receiving as first input from the graphical user interface one of a plurality of predefined classes to be associated with the selected trace anomaly; and
receiving as second input from the graphical user interface one of a plurality of predefined actions to be assigned for the selected trace anomaly.

9. A non-transitory computer-readable medium having instructions, which, when executed by a processor cause the processor to:
receive a multiplicity of original traces from respective semiconductor equipment sensors;
identify at least a first key feature for the multiplicity of original traces using the processor-based model;
identify a plurality of anomalies in at least a first set of traces of the multiplicity of original traces;
modify each of the first set of traces on the basis of the first key feature;
generate a basis set of features from each of the modified first set of traces;
create a plurality of reconstructed traces from the modified first set of traces and the basis set of features; and
generate instructions for training a machine learning model to detect and classify anomalies based on the first set of traces, the modified first set of traces, and the reconstructed traces;
the computer-readable medium deployed into a processor that monitors a semiconductor equipment operating environment for identifying and classifying anomalies in trace data.

* * * * *